United States Patent [19]

Kamon et al.

[11] Patent Number: 5,311,249
[45] Date of Patent: May 10, 1994

[54] PROJECTION EXPOSURE APPARATUS

[75] Inventors: Kazuya Kamon, Itami; Teruo Miyamoto, Amagasaki, both of Japan

[73] Assignee: Mitsubishi Denki Kabushiki Kaisha, Tokyo, Japan

[21] Appl. No.: 14,855

[22] Filed: Feb. 8, 1993

[30] Foreign Application Priority Data

Feb. 13, 1992 [JP] Japan .................................. 4-026467

[51] Int. Cl.⁵ ........................ G03B 27/72; G03B 27/42
[52] U.S. Cl. .......................................... 355/71; 355/53
[58] Field of Search ........................... 355/53, 67, 71; 359/628; 356/399

[56] References Cited

U.S. PATENT DOCUMENTS

| | | | |
|---|---|---|---|
| 5,144,362 | 9/1992 | Kamon et al. | 355/53 |
| 5,251,067 | 10/1993 | Kamon | 359/628 |
| 5,253,040 | 10/1993 | Kamon et al. | 356/399 |

FOREIGN PATENT DOCUMENTS 6191662 5/1986 Japan .

Primary Examiner—Richard A. Wintercorn
Attorney, Agent, or Firm—Leydig, Voit & Mayer

[57] ABSTRACT

A projection exposure apparatus includes a light source, a condenser lens for illuminating an illumination light emanating from the light source onto a mask on which a circuit pattern has been formed, a projection lens for condensing the illumination light which has passed through the mask onto a surface of a wafer, and an aperture member disposed between the light source and the condenser lens and having both a transmission area for shaping the light emanating from the light source and a light blocking area formed at a central portion of the transmission area. An outer diameter of the transmission area of the aperture member is set such that a ratio $\sigma$ of an outer diameter of an effective light source to a diameter of a pupil of the projection lens is $0.6 \pm 0.3$, while a light blocking rate of the light blocking area is set to $60 \pm 35\%$.

5 Claims, 8 Drawing Sheets

PROJECTION EXPOSURE APPARATUS

BACKGROUND OF THE INVENTION

1. Field of the Invention

The present invention relates to a projection exposure apparatus for forming fine patterns required for manufacture of LSIs.

2. Description of the Related Art

FIG. 7 shows an optical system of a conventional projection exposure apparatus. The optical system includes a lamp house 1, a mirror 2, a fly's eye lens 3 disposed in front of the lamp house 1 with the mirror 2 between the lamp house 1 and the fly's eye lens 3, an aperture member 4 located in front of the fly's eye lens 3, condenser lenses 5 and 6, a mirror 7, a photo mask 8 including a circuit pattern, a projection lens 9, and a wafer 10 located in front of the mask 8 with the projection lens 9 between the mask 8 and the wafer 10. The aperture member 4 has a disk-like shape including a circular open portion 4a, as shown in FIGS. 8 and 9.

Light rays emanating from the lamp house 1 reach the fly's eye lens 3 through the mirror 2, and are split into regions by the individual lenses 3a of the fly's eye lens 3. The rays which have passed through the individual lenses 3a pass through the aperture portion 4a of the aperture member 4, the condenser lens 5, the mirror 7 and the condenser lens 6, and then illuminate the entire surface of the exposure area of the mask 8. Therefore, on the surface of the mask 8, the rays from the individual lenses 3a of the fly's eye lens 3 are laid on top of one another, and the mask 8 is thus uniformly illuminated. The light rays which have passed through the mask 8 in the manner described above pass through the projection lens 9 and then reach the wafer 10, whereby transfer of the circuit pattern on the surface of the wafer 10 is achieved.

In such a projection exposure apparatus, the minimum resolution R is proportional to $\lambda/NA$, where $\lambda$ is the wavelength of the illumination light and NA is the numerical aperture. Thus, the resolution of the conventional projection exposure apparatus is improved by designing an optical system such that the numerical aperture NA is increased, thereby providing an exposure apparatus which can cope with the increase in the degree of integration of LSIs has taken place in recent years.

However, although an increase in numerical aperture NA of the optical system improves the resolution R, it further reduces the depth of focus DOF of the projection exposure apparatus. The depth of focus DOF is proportional to $\lambda/NA^2$. Therefore, in a conventional projection exposure apparatus, an increase in the resolution reduces the depth of focus and thus deteriorates the transfer accuracy.

Here, the numerical aperture NA of the optical system is expressed by $\sin \theta$, where $\theta$ is the angle of incidence of the light incident on a wafer 10. Thus, the larger the angle of incidence $\theta$ with respect to the wafer 10, the shorter the depth of focus DOF.

Hence, Japanese Patent Laid-Open No. 61-91662 has proposed a projection exposure apparatus which employs a ring-shaped aperture member. In this exposure apparatus, only the light which has passed through the peripheral portion of the aperture member is utilized by employing the ring-shaped aperture member. Consequently, in the diffracted light of the first order which is incident on the wafer, the components having a large angle of incidence are blocked, whereby the numerical aperture NA of the optical system is reduced and hence the depth of focus DOF is improved. Therefore, it has been described in the above-mentioned invention that the resolution is improved while the depth of focus DOF is enlarged by employing only the light which passes through the outermost portion of the aperture member.

However, when a large ring-shaped light source is employed so that only the light which passes through the outermost portion of the aperture member is used, as described in the above-mentioned publication, a light source image $S_0$ of the zeroth order and light source images $S_1$ and $S_2$ of $\pm$ first order are produced on the surface of a pupil 9a of the projection lens, as shown in FIG. 10. As a result, the angle of incidence of the light of the zeroth order is increased, and hence the depth of focus DOF deteriorates. In FIG. 10, hatched portions $P_0$ through $P_2$ indicate the light blocked portions formed by the ring-shaped aperture member.

SUMMARY OF THE INVENTION

Accordingly, an object of the present invention is to provide a projection exposure apparatus improving resolution and enlarging the depth of focus DOF at the same time.

In order to achieve the above object, there is provided a projection exposure apparatus which comprises a light source, a condenser lens for condensing an illumination light emanating from the light source onto a mask including a circuit pattern, a projection lens for condensing the illumination light which has passed through the mask onto a surface of a wafer, and an aperture member disposed between the light source, the aperture member the condenser lens and having both a transmission area for shaping the light emanating from the light source and a light blocking area formed at a central portion of the transmission area. The outer diameter of the transmission area of the aperture member is set such that a ratio $\sigma$ of the outer diameter of an effective light source to the diameter of a pupil of the projection lens is $0.6\pm0.3$, so that the light blocking ratio of the light blocking area is $60\pm35\%$.

DESCRIPTION OF THE PREFERRED EMBODIMENTS

Embodiments of the present invention will be described below with reference to the accompanying drawings.

A first embodiment of the present invention will now be described with reference to FIGS. 1 through 4.

Figure 1:
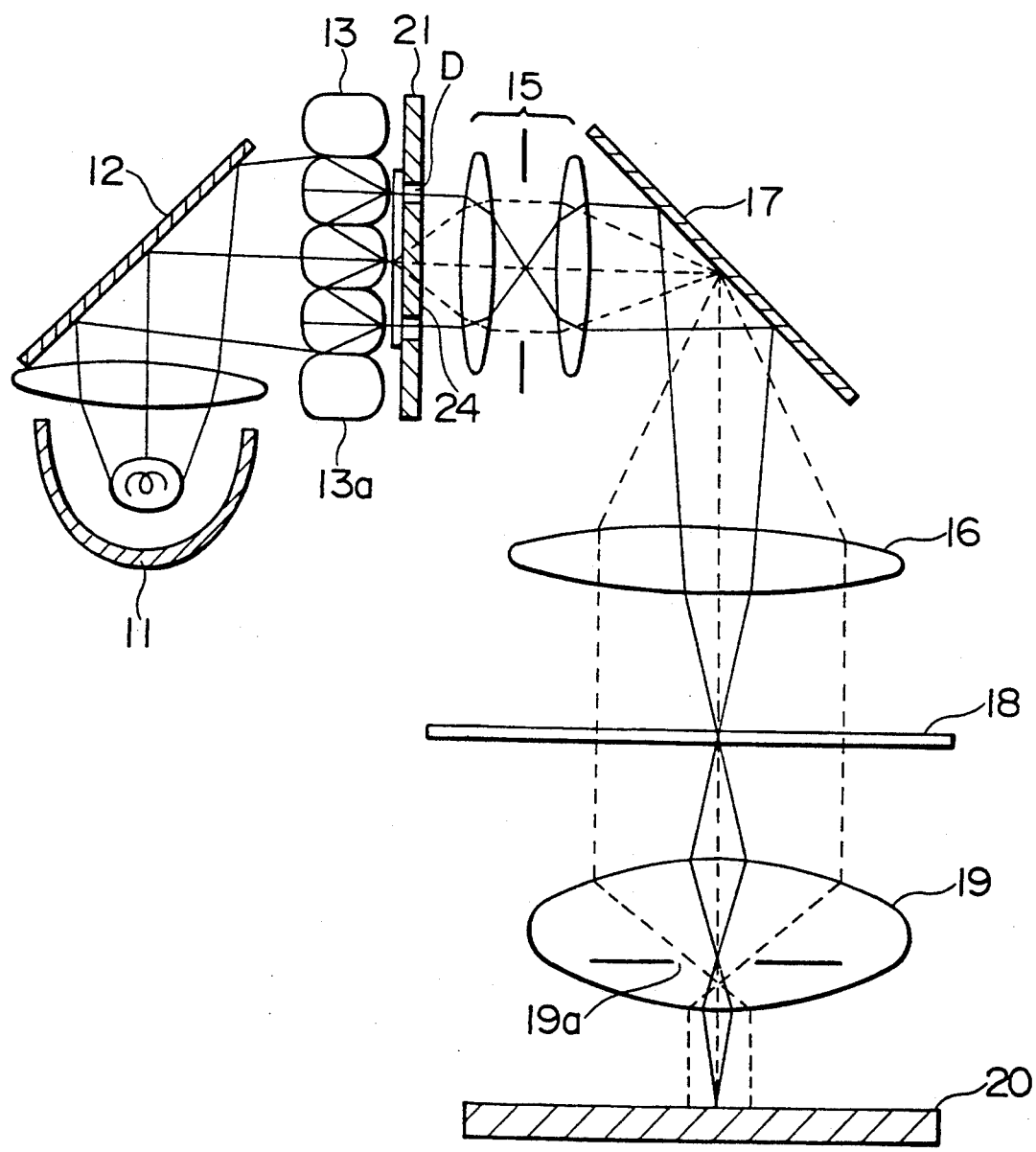
FIG. 1 shows an optical system of a projection exposure apparatus according to a first embodiment of the present invention.

Referring first to FIG. 1, an exposure apparatus includes a lamp house 11 for emanating an illumination light having a wavelength of $\lambda$, a mirror 12, a fly's eye lens 13 disposed in front of the lamp house 11 with the mirror 12 between the lamp house 11 and the fly's eye lens 13, an aperture member 21 located in front of the fly's eye lens 13, condenser lenses 15 and 16, a mirror 17, a mask 18 for exposure including a circuit pattern, a projection lens 19, and a wafer located in front of the mask 18 with the projection lens 19 between the mask 18 and the wafer 20.

Figure 2:
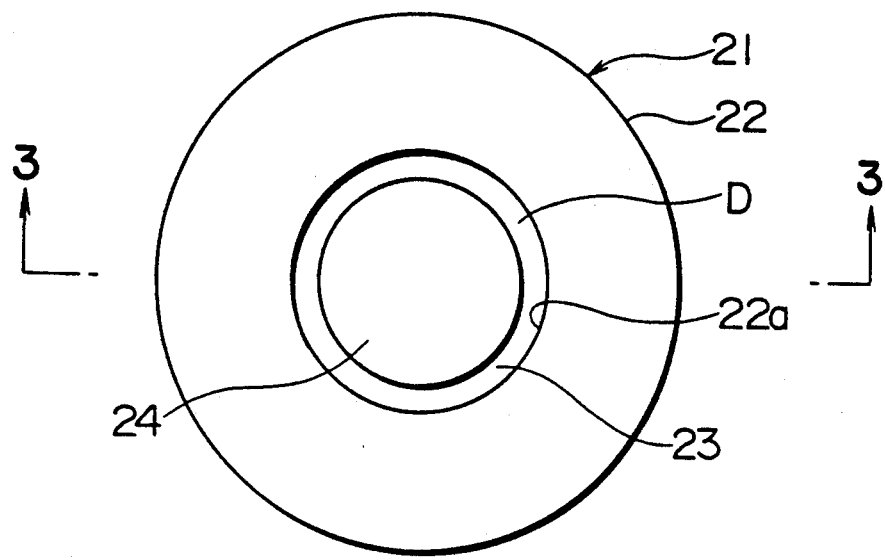
FIG. 2 is a plan view showing an aperture member employed in the first embodiment.
Figure 3:
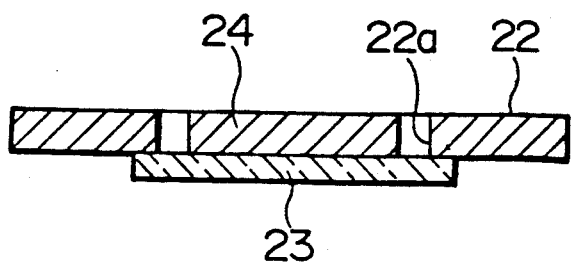
FIG. 3 is a cross-section taken along the line 3—3 of FIG. 2 in the direction indicated by arrows.

As shown in FIGS. 2 and 3, the aperture member 21 includes an annular outer frame 22 having a circular open portion 22a at the central portion thereof, a transparent member 23 formed such that it covers the entirety of the open portion 22a of the outer frame 22, and a circular light blocking member 24 disposed on the surface of the transparent member 23 at the central portion of the open portion 22a of the outer frame 22. The open portion 22a of the outer frame 22 forms a transmission area D which passes the light from the lamp house 11, and the light blocking member 24 covers a light blocking area. The transmission area D has a size which ensures that the ratio $\sigma$ of the outer diameter of the effective light source to the diameter of the pupil 19a is 0.6±0.3 on the surface of the pupil of the projection lens 19. The light blocking area is formed such that a light blocking rate r, expressed by the ratio of the light blocking area to area of the open portion 22a of the outer frame 22, is 60±35%.

Both of the outer frame 22 and the light blocking member 24 are a metallic material, such as aluminum. The transparent member 23 is, for example, glass. The light blocking member 24 may be formed by depositing a metal material on the transparent member 23.

The operation of this embodiment will be described below. The illumination light emanating from the lamp house 11 reaches the fly's eye lens 13 through the mirror 12, and is split into regions corresponding to individual lenses 13a of the fly's eye lens 13. The light rays emanating from the individual lenses 13a pass through the transmission area D of the aperture member 21, the condenser lens 15, the mirror 17 and then the condenser lens 16, and then illuminate the entire surface of the exposure area of the mask 18. Therefore, on the surface of the mask 18, the light rays from the individual lenses 13a of the fly's eye lens 13 are laid on top of one another, and the mask surface is thus illuminated uniformly. The light which has passed through the mask 18 in the manner described above reaches the wafer 20 through the projection lens 19, whereby transfer of the circuit pattern on the surface of the wafer 20 is achieved.

Figure 4:
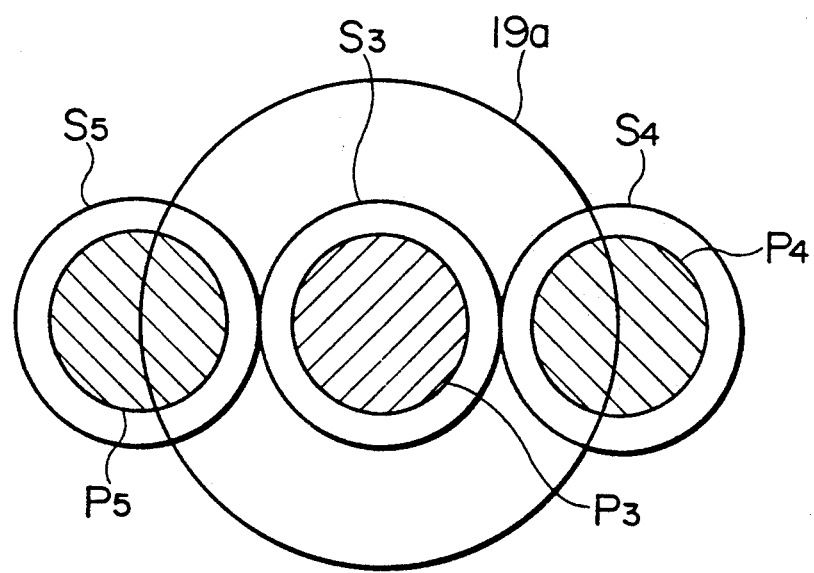
FIG. 4 shows light source images formed on a pupil of a projection lens in the first embodiment.

FIG. 4 shows light source images formed on the pupil 19a of the projection lens 19 when the ratio $\sigma$ of the transmission area D of the aperture member 21 is 0.5, the light blocking rate r of the light blocking area is about 56% and the circuit pattern of the mask 18 has a line-and-space pattern at a resolution close to the limit of the projection lens. A light source image $S_3$ of the zeroth order is formed at the central portion of the pupil 19a, and light sources $S_4$ and $S_5$ of ± first order are formed on the right and left side of the light source image $S_3$ of the zeroth order. The light source images $S_3$ through $S_5$ respectively have circular light blocking portions $P_3$ through $P_5$ which are formed by the light blocking member 24 of the aperture member 21. In the diffracted light of the first order which is incident on the wafer 20 by the light blocking portions $P_4$ and $P_5$ of the light source images $S_4$ and $S_5$ of the first order, the components thereof having a large angle of incidence are blocked while the angle of incidence of the diffracted light of the zeroth order is not increased excessively. As a result, resolution is improved and enlargement of the depth of focus DOF is suitably achieved.

Figure 5:
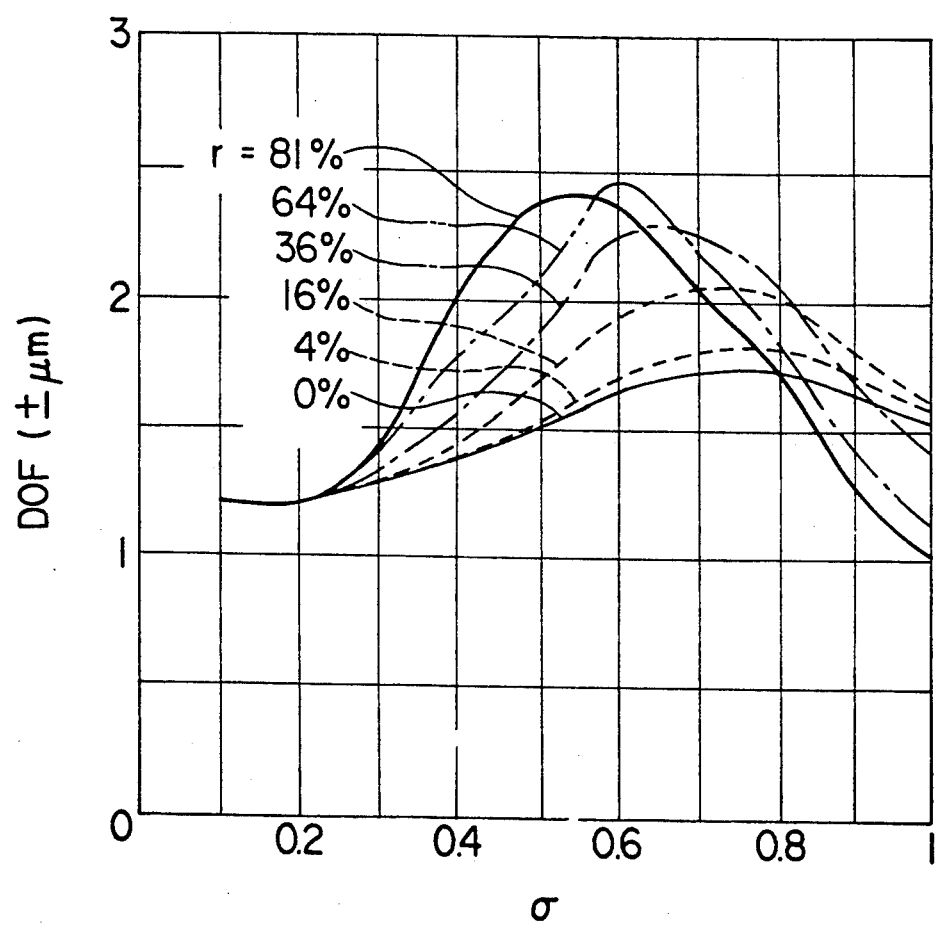
FIG. 5 shows the relation between the ratio $\sigma$ of the outer diameter of an effective light source to the diameter of a pupil of a projection lens and depth of focus DOF when light blocking rate r of a light blocking area of the aperture member varies.

FIG. 5 shows the relation between the ratio $\sigma$ of the outer diameter of the effective light source to the diameter of the pupil of the projection lens 19 and the depth of focus DOF, which is obtained when the light blocking rate r of the light locking area of the aperture member 21 varies. The results of the measurements performed using a line-and-space pattern of 0.5 $\mu$m are shown in FIG. 5. The light blocking rate r was changed stepwise from 0% to 81%. It can be seen from FIG. 5 that an optimum ratio $\sigma$ exists at each of the light blocking rates. Particularly, when r=64% and $\sigma$=0.6, the depth of focus DOF was enlarged most. Hence, in the present invention, the optimum ratio $\sigma$ and that of the light blocking rate r which ensure an improvement in resolution and an enlargement of the depth of focus DOF are 0.6±0.3 and 60±35%, respectively.

Figure 6:
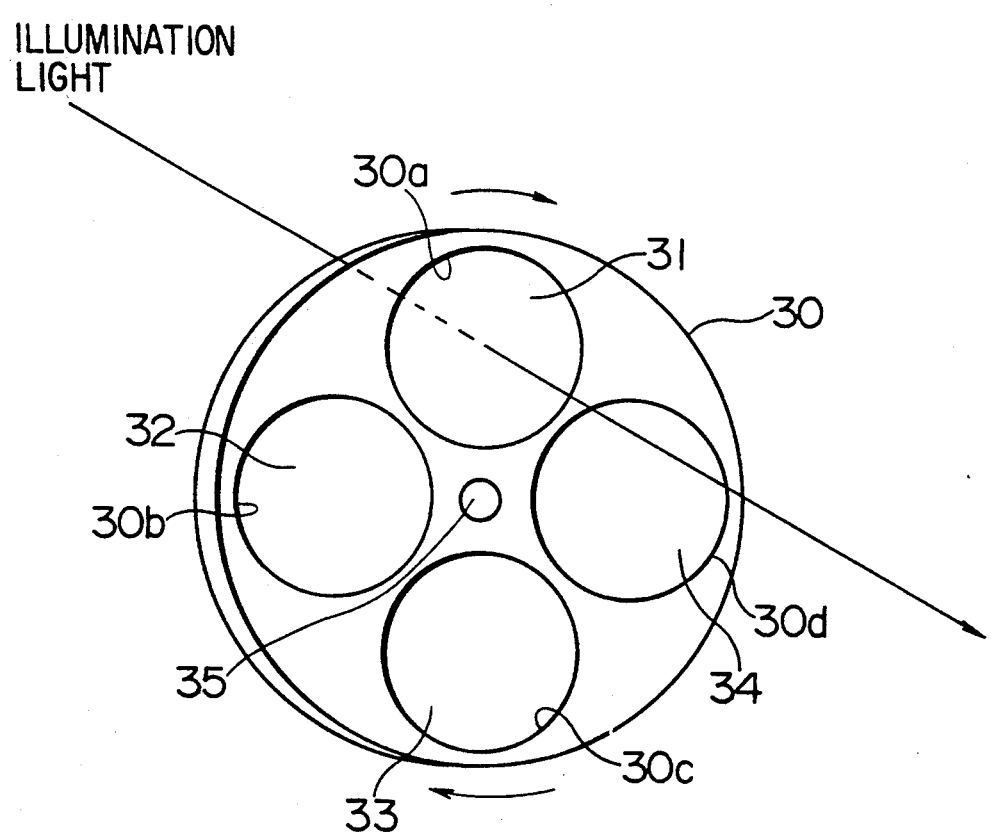
FIG. 6 shows a device employed in a second embodiment of the present invention.
Figure 7:
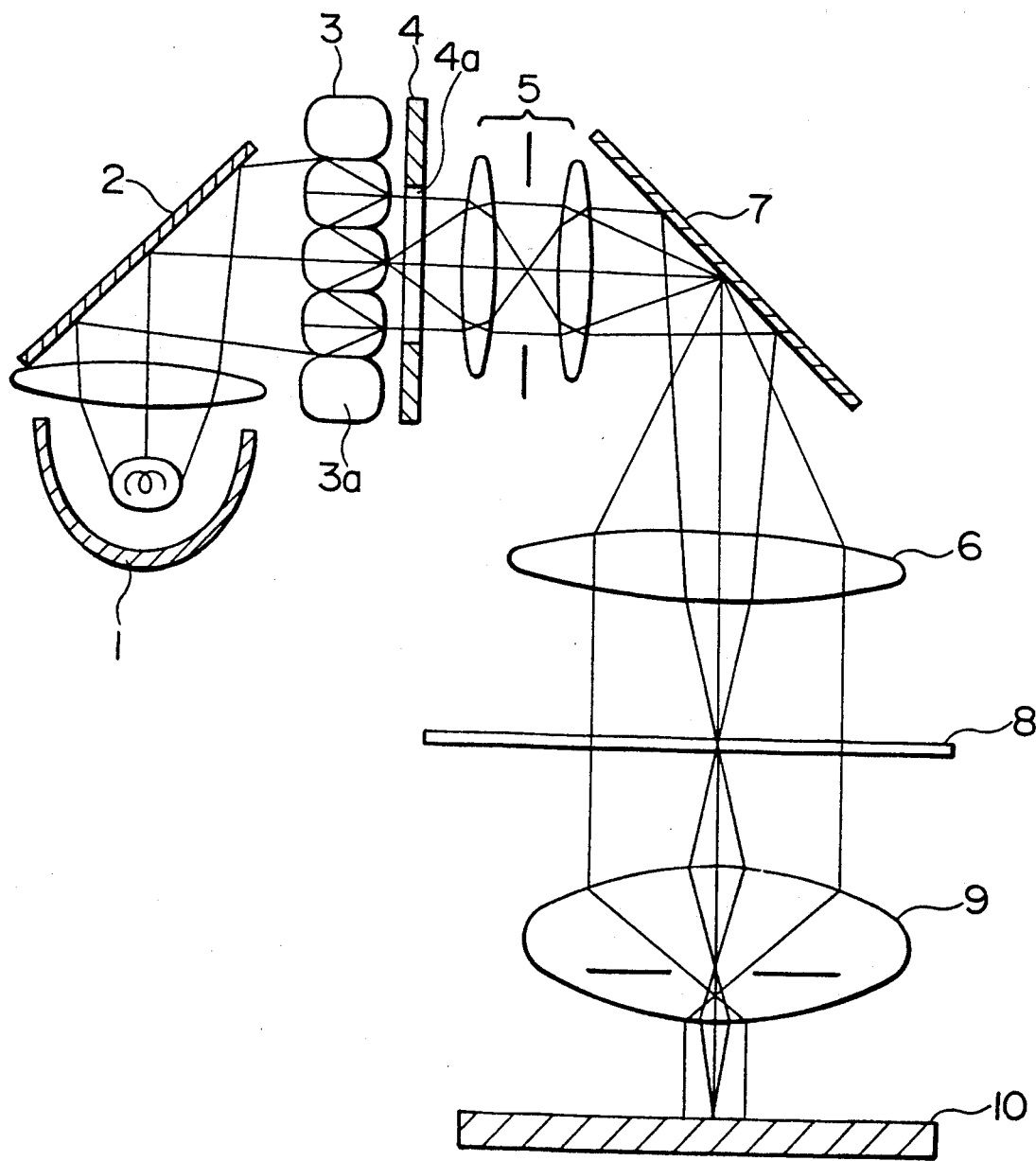
FIG. 7 shows an optical system of a conventional projection exposure apparatus.
Figure 8:
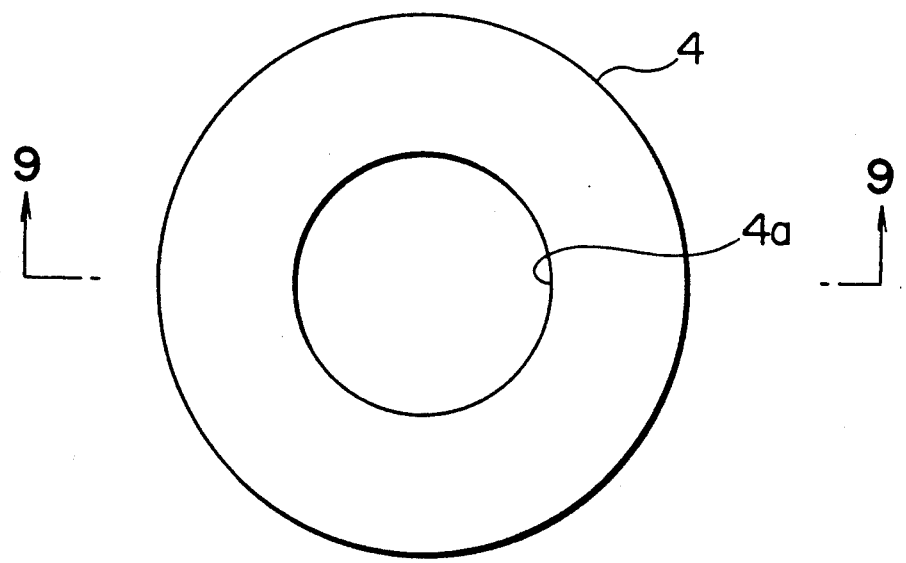
FIG. 8 is a plan view of an aperture member employed in the device of FIG. 6.
Figure 9:
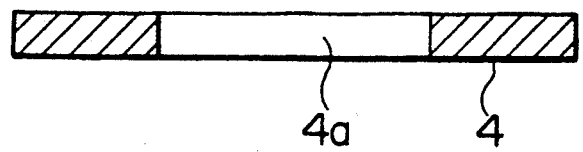
FIG. 9 is a cross-section taken along the line 9—9 of FIG. 8 and as viewed in the direction indicated by arrows.
Figure 10:
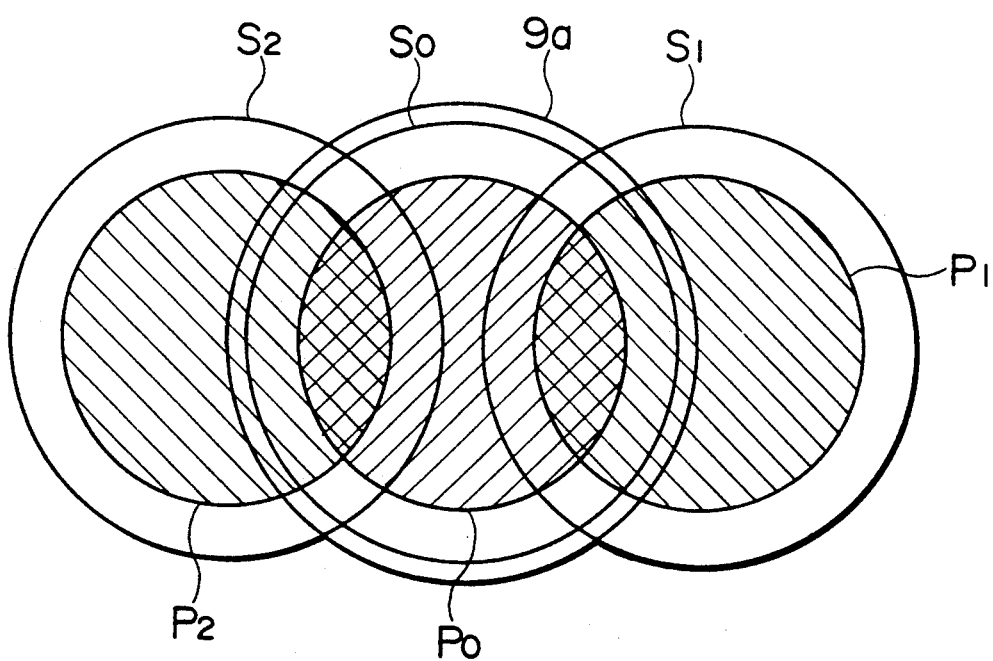
FIG. 10 shows light source images formed on a pupil of a projection lens in another conventional projection exposure apparatus.

It may also be arranged such that a single aperture member is not fixed in the optical path of the illumination light and an aperture member suited to the exposure process and selected from a plurality of aperture members is used. FIG. 6 shows a device used for such an arrangement. A disk-like substrate 30 has four open portions including first, second, third and fourth open portions 30a through 30d. Different aperture members 31 through 33 are respectively provided in the first through fourth open portions 30a through 30d. The aperture members 31 through 34 may differ in the shape or size of the transmission area and light blocking area, or may not have the light blocking area at the central portion and have only the transmission area.

The substrate 30 is rotatable about a central portion 35 thereof. It is therefore possible to selectively locate any of the four open portions 30a through 30d on the optical path of the illumination light by rotating the substrate 30. Accordingly, the optimum aperture member can be selected for each exposure process.

What is claimed is:

1. A projection exposure apparatus comprising:
   a light source for producing illumination light;
   a condenser lens for condensing the illumination light emanating from said light source onto a mask including a circuit pattern;
   a projection lens having a pupil with a diameter, said projection lens for condensing the illumination light that has passed through the mask onto a surface of a wafer; and an aperture member disposed between said light source and said condenser lens and having a transmission area with an outer diameter for shaping the light emanating from said light source and a light blocking area at a central portion of said transmission area, the outer diameter of said transmission area of said aperture member being set such that a ratio $\sigma$ of an outer diameter of an effective light source to the diameter of the pupil of said projection lens is $0.6 \pm 0.3$ while a ratio of said light blocking area to the transmission area is $60 \pm 35\%$.

2. A projection exposure apparatus according to claim 1 wherein said aperture member includes an annular frame having a circular central open portion, a transparent member covering the open portion of said annular frame, and a circular light blocking member disposed on said transparent member at a central portion of the open portion of said annular frame.

3. A projection exposure apparatus according to claim 2 wherein said annular frame and said light blocking member are a metallic material and said transparent member is glass.

4. A projection exposure apparatus according to claim 1 comprising a plurality of aperture members having different ratios $\sigma$ and different light blocking ratios of the light blocking areas to the transmission area and a device for selectively locating one of said plurality of aperture members in an optical path of the illumination light.

5. A projection exposure apparatus according to claim 4 wherein said device has a rotatable disk-like substrate including a plurality of open portions, said polarizers being mounted in respective open portions.

* * * * *